United States Patent
Mu et al.

(10) Patent No.: US 9,081,708 B2
(45) Date of Patent: Jul. 14, 2015

(54) DYNAMIC READ SCHEME FOR HIGH RELIABILITY HIGH PERFORMANCE FLASH MEMORY

(71) Applicants: Fuchen Mu, Austin, TX (US); Yanzhou Wang, Austin, TX (US)

(72) Inventors: Fuchen Mu, Austin, TX (US); Yanzhou Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 13/679,481

(22) Filed: Nov. 16, 2012

(65) Prior Publication Data
US 2014/0143630 A1    May 22, 2014

(51) Int. Cl.
G11C 29/50 (2006.01)
G06F 11/10 (2006.01)
G11C 29/04 (2006.01)

(52) U.S. Cl.
CPC ...... *G06F 11/1048* (2013.01); *G11C 29/50004* (2013.01); *G06F 11/1008* (2013.01); *G06F 11/1068* (2013.01); *G11C 2029/0411* (2013.01)

(58) Field of Classification Search
CPC .. G11C 29/50; G11C 29/50004; G11C 16/04; G06F 11/1068; G06F 11/1072; G06F 11/1008
USPC .......... 714/763, 773, 752, 746, 760, 745, 721
See application file for complete search history.

(56) References Cited

U.S. PATENT DOCUMENTS

| | | | |
|---|---|---|---|
| 8,000,141 B1 | 8/2011 | Shalvi | |
| 2006/0028875 A1 | 2/2006 | Avraham et al. | |
| 2009/0228739 A1 | 9/2009 | Cohen et al. | |
| 2010/0064200 A1 * | 3/2010 | Choi et al. | 714/773 |
| 2010/0205504 A1 * | 8/2010 | Fung et al. | 714/752 |
| 2012/0120732 A1 * | 5/2012 | Lee et al. | 365/185.22 |
| 2012/0203951 A1 * | 8/2012 | Wood et al. | 711/102 |
| 2012/0254699 A1 * | 10/2012 | Ruby et al. | 714/773 |
| 2013/0346671 A1 * | 12/2013 | Michael et al. | 711/103 |

* cited by examiner

*Primary Examiner* — Albert Decady
*Assistant Examiner* — Christian Dorman

(57) ABSTRACT

In accordance with at least one embodiment, a method and apparatus for improving the ability to correct errors in memory devices is described. At least one embodiment provides a way to salvage the part even it has double-bit or multi-bit error from the same ECC section, thus improving product reliability and extending the product lifetime. During a normal read, if a double-bit or multiple-bit error happens, which ECC can detect but cannot fix, the error is corrected by adjusting the read voltage level and reading again to determine the proper read level (and, therefore, the correct value being read). This dynamic read scheme can apply to extrinsic bits from either erase state or program state. It can be also used in a single bit scenario to minimize ECC occurrence and save ECC capacity.

12 Claims, 8 Drawing Sheets

US 9,081,708 B2

DYNAMIC READ SCHEME FOR HIGH RELIABILITY HIGH PERFORMANCE FLASH MEMORY

BACKGROUND OF THE INVENTION

1. Field of the Invention

The present disclosure relates generally to memory devices and, more specifically, to a technique for salvaging memory devices exhibiting errors.

2. Description of the Related Art

Various phenomena can affect data retention in non-volatile memory (NVM). For example, some causes of limited data retention and data errors are intrinsic, while others are extrinsic. Examples of extrinsic causes of limited data retention and data errors include oxide layer variations and defects, ionic contamination, etc. Since such extrinsic causes affect data retention, and data retention involves retaining data over time, data errors arising from extrinsic causes often take considerable time to occur. When a data error affecting a particular bit has occurred, the state of that bit is the opposite its correct value, that is the incorrect value. Thus, the bit can be said to have flipped.

During flash memory operation (e.g., data retention, operating life, etc.), it is almost inevitable that some extrinsic bits will come out of population, from erase state, from program state, or from both. Error Correction Code (ECC) can be used to correct the extrinsic bits once bit flip happens.

ECC has a capacity limit, e.g., a typical ECC algorithm may not be able to correct double-bit or multi-bit errors from the same ECC section. While ECC typically cannot correct such errors, it can detect all double-bit errors and 70% of triple-bit errors. However, the detection of uncorrectable errors leads to the situation that, whenever these errors happen, a memory part being tested will fail testing, as the inability to correct such errors prevents the memory part from reliably storing data in the locations where the errors occurred.

Failure of a memory part as a result of uncorrectable double-bit or multi-bit errors reduces the yield of the manufacturing process and can reduce reliability of the memory parts overall.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE DISCLOSURE

Figure 1:
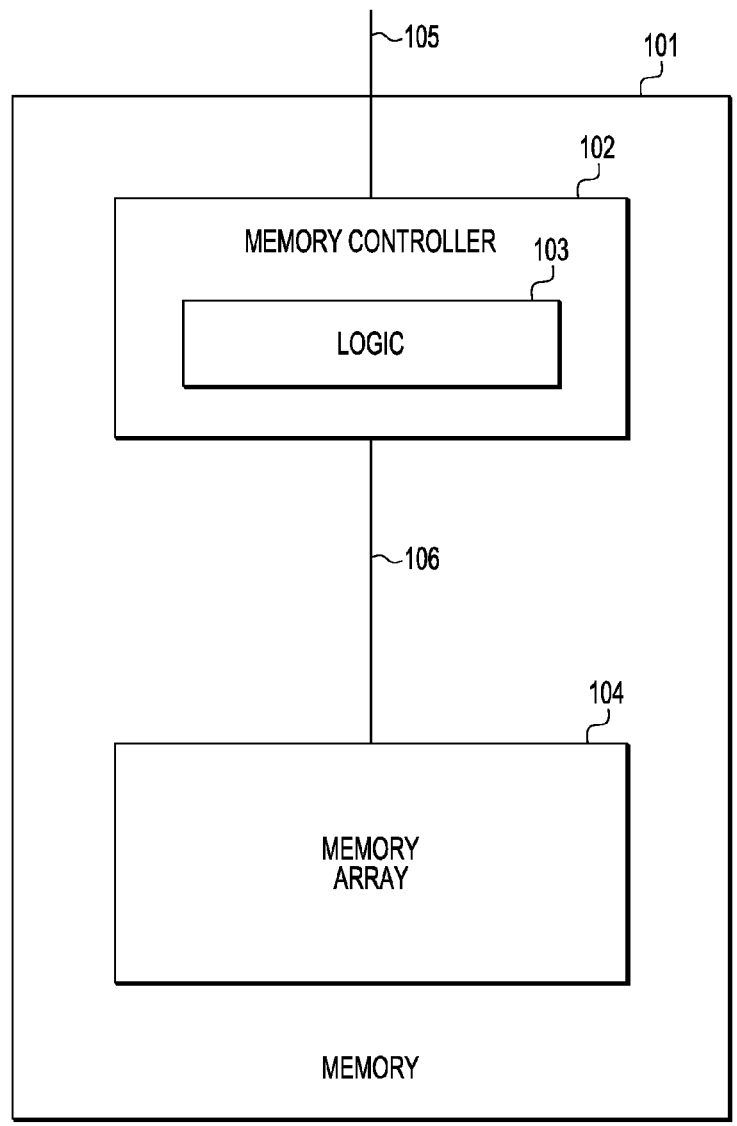
FIG. 1 is a block diagram illustrating a memory device in accordance with at least one embodiment.

In accordance with at least one embodiment, a method and apparatus for improving the ability to correct errors in memory devices is provided. At least one embodiment provides a way to modify settings of the memory device subsequent to detecting a double-bit or multi-bit error from the same ECC section in such a way that the device is salvaged, e.g., the error is corrected, thus improving product yield, reliability, and extending the product lifetime. During a normal read operation, if a double-bit or multiple-bit error happens, which a typical ECC technique can, with some probability, detect but cannot correct, the error is corrected by adjusting the read voltage level and reading again to determine the proper read level (and, therefore, the correct value being read). This dynamic read scheme can apply to extrinsic bits from either erase state or program state. An embodiment may be applied in a single bit error scenario to minimize ECC utilization and save ECC capacity, thereby effectively extending ECC capacity.

A distinction between application of an embodiment to single-bit errors and application of an embodiment to double-bit or multiple-bit errors can be understood in relation to a number of bit read errors occurring within a specific ECC section, which is a quantity of data in a memory array within which error correction is applied using a common ECC value. For example, an ECC technique may be capable of detecting and correcting single bit error within each ECC section, such that an ECC technique may be capable of detecting and correcting single bit errors in each of several ECC sections, each associated with a different ECC value, but may be less effective at detecting (and may be unable to correct) when multiple bit errors occur in the same ECC section. Thus, one embodiment of error correction may be applied to a case where a single-bit error occurs in an ECC section, and another embodiment of error correction may be applied to cases where a double-bit error (which, as used herein, means two erroneous bits in a single ECC section) or a multiple-bit error (which, as used herein, means more than two erroneous bits in a single ECC section) occurs.

Whenever a double-bit or multiple-bit error occurs, a correction algorithm referred to as a salvage scheme may be enabled to attempt to correct all erroneous bits or at least all but a number of erroneous bits detectable and correctable by an existing ECC technique (e.g., all but one erroneous bits). For a double-bit or multiple-bit error, an existing ECC technique can, with some probability, detect the existence of the double-bit or multiple-bit error but may not be able to ascertain the proper values of the erroneous bits and thus may not be able to correct the erroneous bits. By varying the read voltage level in both directions (e.g., higher and lower than the read voltage level used for the read operation that detected the double-bit or multiple-bit error), an adjusted read voltage level may be found that either reads all of the bits of an ECC section correctly, e.g., passes the ECC test, or that reduces the number of read errors within the ECC section to a number which the ECC technique can correct (e.g., a single-bit error). Accordingly, what would have been detectable but uncorrectable read errors under an existing ECC technique now can often be correctable errors which can be corrected as disclosed herein. In the case of a double-bit or multiple-bit error, the read voltage level is adjusted in both directions and the same memory location is read again using each of the adjusted voltage levels to determine a new read level. Thus, the read voltage level is decreased relative to the read voltage level at which the error occurred, and the memory is read again, and the read voltage level is increased relative to the read voltage level at which the error occurred, and the memory is read again. The decreased read voltage level and the increased read voltage level are both compared to an allowable read voltage range. If either the decreased read voltage level or the increased read voltage level exceeds the allowable read voltage range, the part is failed as unsalvageable. However, if both the decreased read voltage level and the increased read voltage level are within the allowable read voltage range, the process continues. If both the decreased read voltage level and the increased read voltage level result in continued erroneous reads, which may, for example, be determined using the error detection capability of the ECC, or both the decreased read voltage level and the increased read voltage level result in correct reads, which may also, for example, be determined using the error detection capability of the ECC, the decreased read voltage level is further decreased and the increased read voltage level is further increased. Then, if the decreased read voltage level and the increased read voltage level are both within the allowable read voltage range, reads are performed with the further decreased read voltage level and the further increased read voltage level. If, however, only one of the decreased read voltage level and the increased read voltage level (or a subsequent further decreased read voltage level and further increased read voltage level) yields an error-free read, the one which yields the error-free read is chosen as the new read voltage level, thereby salvaging the memory part In accordance with at least one embodiment, if either the decreased read voltage level or the increased read voltage level results in correct reads, which may, for example, be determined using the error detection capability of the ECC, a new read voltage is selected from the group consisting of the decreased read voltage level or the increased read voltage level. For example, either the decreased read voltage level or the increased read voltage level may be selected to be used as the new read voltage. However, if both the decreased read voltage level and the increased read voltage level result in continued erroneous reads, which may, for example, be determined using the error detection capability of the ECC, the decreased read voltage level is further decreased and the increased read voltage level is further increased. Then, if the decreased read voltage level and the increased read voltage level are both within the allowable read voltage range, reads are performed with the further decreased read voltage level and the further increased read voltage level. With some ECC technologies, a situation where both the decreased read voltage level and the increased read voltage level result in seemingly correct reads, as indicated using the error detection capabilities of the ECC. Because this situation can result from a greater number of erroneous bits than the ECC can reliability detect, in accordance with at least one embodiment, when such a situation occurs, an indication that the memory device has failed may be provided and reliance upon questionable ECC information can be avoided.

In accordance with an embodiment applied to a single extrinsic bit error, if the extrinsic bit is from the erase population, the read voltage level is increased, e.g., moved closer to a programmed population, and the memory is read again, if necessary further increasing the increased read voltage level within the allowable voltage range and reading the memory yet again until it passes; if the extrinsic bit is from the program population, e.g., the bit is expected to be programmed but is read as erased, the bit is further subject to programming and read again. If programming fails, the read voltage level is lowered, and the memory is read again, if necessary further decreasing the decreased read voltage level within the allowable voltage range and reading the memory yet again until it passes. The read voltage level is checked against an allowable read voltage range. If the read voltage level is out of the allowable read voltage range and the read still fails, the part is failed, designating it to be unsalvageable wherein the devices provides an indication as to its failure. However, if the read voltage level remains in the allowable read voltage range, after the part passes the read correctly, the method goes to the next block in the operation. The part is salvaged successfully.

FIG. 1 is a block diagram illustrating a memory device in accordance with at least one embodiment. Memory 101 comprises memory array 104 and memory controller 102. Memory controller 102 is coupled to memory array 104 via bus 106. Memory controller 102 is coupled to an external bus 105. As an example, memory controller 102 includes control circuitry 103, which may comprise a state machine, a general or special purpose instruction based processor and the like. As an example, control circuitry 103 may be implemented as hardware logic circuitry. As another example, control circuitry 103 may be embodied as circuitry executing instruction code stored on a nontransitory storage medium, such as a NVM or disk-based storage device to perform control operations according to such control circuitry 103. For example, control circuitry 103 may perform memory control operation in memory controller 102 to cause memory controller 102 to perform a method in accordance with at least one embodiment. As an example, control circuitry 103 may perform memory control operation in memory controller 102 to cause memory controller 102 to perform the methods of FIGS. 6 through 10.

Figure 2:
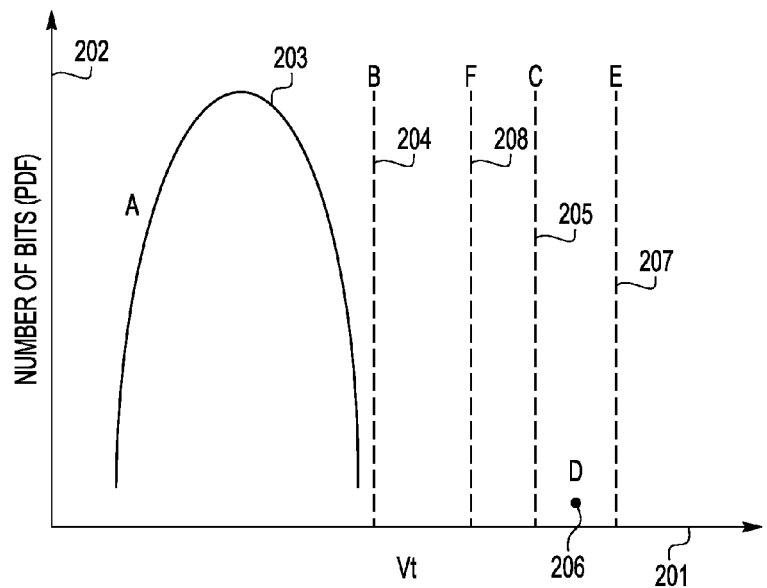
FIG. 2 is a graph illustrating operational levels in relation to an erase distribution and double/multiple extrinsic bits in accordance with at least one embodiment.

FIG. 2 is a graph illustrating operational levels in relation to an erase distribution and double/multiple extrinsic bit errors in accordance with at least one embodiment. The graph is plotted with respect to a linear x axis 201 and a logarithmic y axis 202. The linear x axis 201 represents threshold voltages (Vt), e.g., read voltage, of bit cells containing bits. The logarithmic y axis 202 represents the number of bit cells having the corresponding threshold voltages represented with respect to the linear x axis 201.

The erase distribution of FIG. 2 includes a main erase distribution 203 that is within a normal read level 205 (e.g., the bits of main erase distribution 203 are below the normal read level 205) and is consistent with an expected erase distribution. FIG. 2 also illustrates double/multiple extrinsic bits 206 that are not within the normal read level 205, e.g., they are extrinsic to main erase distribution 203 (e.g., double/multiple extrinsic bits 206 represent those bits that are above normal read level 205). Main erase distribution 203 reflects an erase distribution that would be typical, e.g., an expected erase distribution. Together, main erase distribution 203 and double/multiple extrinsic bits 206 constitute an actual erase distribution. Main erase distribution 203 comprises a plurality of bits, wherein the threshold voltages of bits among the plurality of bits may vary from one another. Double/multiple extrinsic bits 206 may also comprise a plurality of bits, wherein the threshold voltages of bits among the plurality of bits may also vary from one another (and, clearly, from the threshold voltages of the bits of main erase distribution 203). Erase verify level 204 is a voltage slightly higher than the highest voltage of the expected erase distribution 203. Normal read level 205 is higher still in voltage, but lower in voltage than the threshold voltage of double/multiple extrinsic bits 206. Thus, normal read level 205 is insufficient to read the erased double/multiple extrinsic bits 206 accurately. Since error correcting codes (ECC) can detect double/multiple extrinsic bits 206 but may not be able to correct double/multiple extrinsic bits 206, the failure to accurately read double/multiple extrinsic bits 206 can be detected using ECC. Once the double/multiple bit error is detected, in accordance with at least one embodiment, a higher dynamic read level 207, as compared to the normal read level 205, can be used to attempt to read double/multiple extrinsic bits 206, and a lower dynamic read level 208 can also be used to attempt to read the erased double/multiple extrinsic bits 206. Since lower dynamic read level 208 is still lower in voltage than the threshold voltage of double/multiple extrinsic bits 206, attempting to read double/multiple extrinsic bits 206 using lower dynamic read level 208 will not be successful. However, since higher dynamic read level 207 is higher in voltage than the threshold voltage of double/multiple extrinsic bits 206, attempting to read double/multiple extrinsic bits 206 using higher dynamic read level 207 is successful. Thus, the memory can be salvaged by using the higher read voltage 207. It should be noted that, while the use of the lower dynamic read level 208 would not be successful with respect to the example illustrated in FIG. 2, if one or more extrinsic bits from a program distribution (not illustrated in FIG. 2) had existed, the use of lower dynamic read level 208 to attempt to read such extrinsic bits might have allowed the memory to be salvaged, so, given an a priori lack of knowledge about the nature of extrinsic bits, the use of the lower dynamic read level 208 can be beneficial, as it may allow a memory to be salvaged under some circumstances.

By attempting to read double/multiple extrinsic bits 206 using both higher dynamic read level 207 and lower dynamic read level 208, a memory can often be salvaged even from a combination of extrinsic bits from an erase population and/or a program population. For example, extrinsic bits from an erase population can be recovered, so long as the higher dynamic read level 207 is above the threshold voltage level of extrinsic bits 206, and extrinsic bits from a program population can be recovered, so long as the lower dynamic read level 208 is below the threshold voltage level of extrinsic bits 206.

Figure 3:
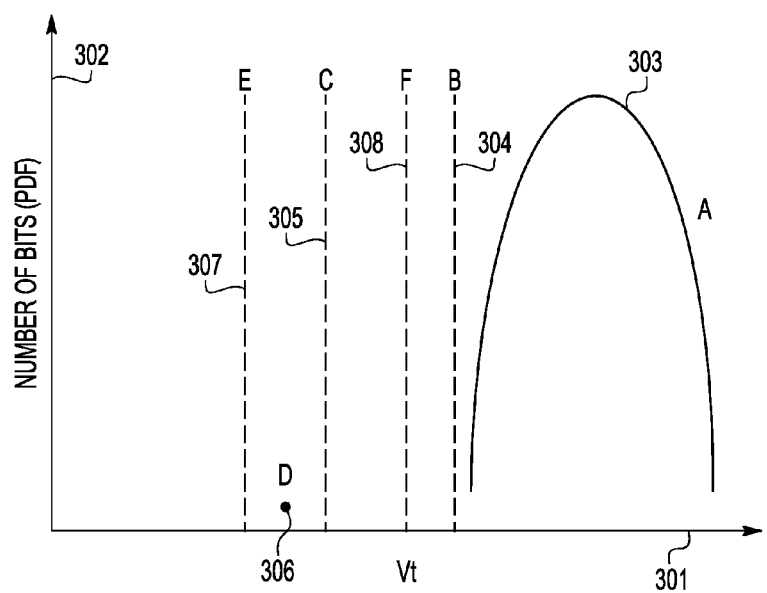
FIG. 3 is a graph illustrating operational levels in relation to a program distribution and double/multiple extrinsic bits in accordance with at least one embodiment.

FIG. 3 is a graph illustrating operational levels in relation to a program distribution and double/multiple extrinsic bits in accordance with at least one embodiment. The graph is plotted with respect to a linear x axis 301 and a logarithmic y axis 302. The linear x axis 301 represents threshold voltages (Vt) of bit cells containing bits. The logarithmic y axis 302 represents the number of bit cells having the corresponding threshold voltages represented with respect to the linear x axis 301.

The program distribution of FIG. 3 includes a distribution 303 that is within a normal read level 305 and consistent with an expected program distribution and double/multiple extrinsic bits 306 that are not within the normal read level 305. Program verify level 304 is a voltage slightly lower than the lowest voltage of the expected program distribution 303. Normal read level 305 is lower still in voltage, but higher in voltage than the threshold voltage of double/multiple extrinsic bits 306. Thus, normal read level 305 is too high to read double/multiple extrinsic bits 306 accurately. Since error correcting codes (ECC) can detect double/multiple extrinsic bits 306 but cannot correct double/multiple extrinsic bits 306, the failure to accurately read double/multiple extrinsic bits 306 can be detected using ECC. Then, in accordance with at least one embodiment, a lower dynamic read level 307 can be used to attempt to read double/multiple extrinsic bits 306 and a higher dynamic read level 308 can be used to attempt to read double/multiple extrinsic bits 306. Since higher dynamic read level 308 is still higher in voltage than the threshold voltage of double/multiple extrinsic bits 306, attempting to read double/multiple extrinsic bits 306 using higher dynamic read level 308 is not successful. However, since lower dynamic read level 307 is lower in voltage than the threshold voltage of double/multiple extrinsic bits 306, attempting to read double/multiple extrinsic bits 306 using lower dynamic read level 307 is successful. Thus, the memory can be salvaged.

By attempting to read double/multiple extrinsic bits 306 using both lower dynamic read level 307 and higher dynamic read level 308, a memory can often be salvaged even from a combination of extrinsic bits from a program population and/or an erase population. For example, extrinsic bits from a program population can be recovered, so long as the lower dynamic read level 307 is below the threshold voltage level of extrinsic bits 306, and extrinsic bits from an erase population can be recovered, so long as the higher dynamic read level 308 is above threshold voltage level of extrinsic bits 306.

Figure 4:
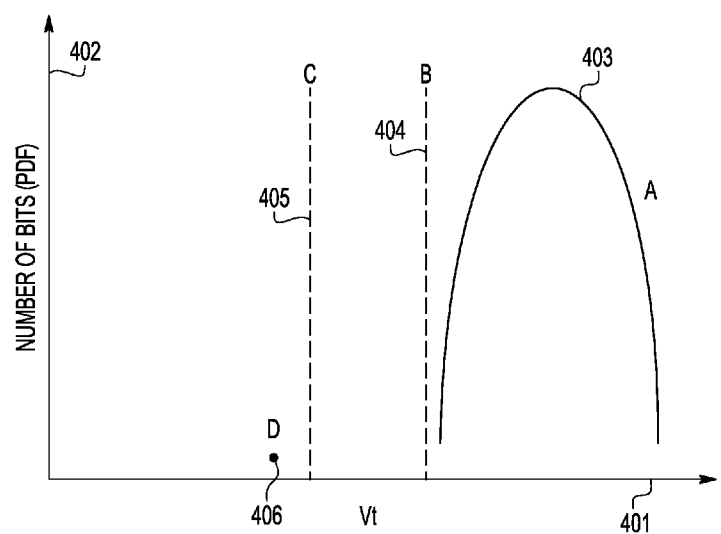
FIG. 4 is a graph illustrating a method to fix a single extrinsic bit from programmed bits by programming the bit up to the program population in accordance with at least one embodiment.

FIG. 4 is a graph illustrating a method to fix a single extrinsic bit from programmed bits by programming the bit up to the program population in accordance with at least one embodiment. The graph is plotted with respect to a linear x axis 401 and a logarithmic y axis 402. The linear x axis 401 represents threshold voltages (Vt) of bit cells containing bits. The logarithmic y axis 402 represents the number of bit cells having the corresponding threshold voltages represented with respect to the linear x axis 401.

Expected program distribution 403 is plotted with respect to linear x axis 401 and logarithmic y axis 402. Program verify level 404 is a voltage slightly lower than the lowest voltage of the expected program distribution 403. Normal read level 405 is lower still in voltage, but higher in voltage than the threshold voltage of single extrinsic bit 406. Thus, normal read level 405 is too high to read single extrinsic bit 406 accurately. Since error correcting codes (ECC) can detect single extrinsic bit 406 and determine the correct value of single extrinsic bit 406, the failure to accurately read single extrinsic bit 406 can be detected using ECC. Then, in accordance with at least one embodiment, since the correct value of single extrinsic bit 406 can be determined, an attempt may be made to program single extrinsic bit 406 up into expected program distribution 403. If single extrinsic bit 406, by reprogramming, can be made to have a threshold voltage within expected program distribution 403, the error detection and reprogramming process is successful. Thus, the memory can be salvaged.

Figure 5:
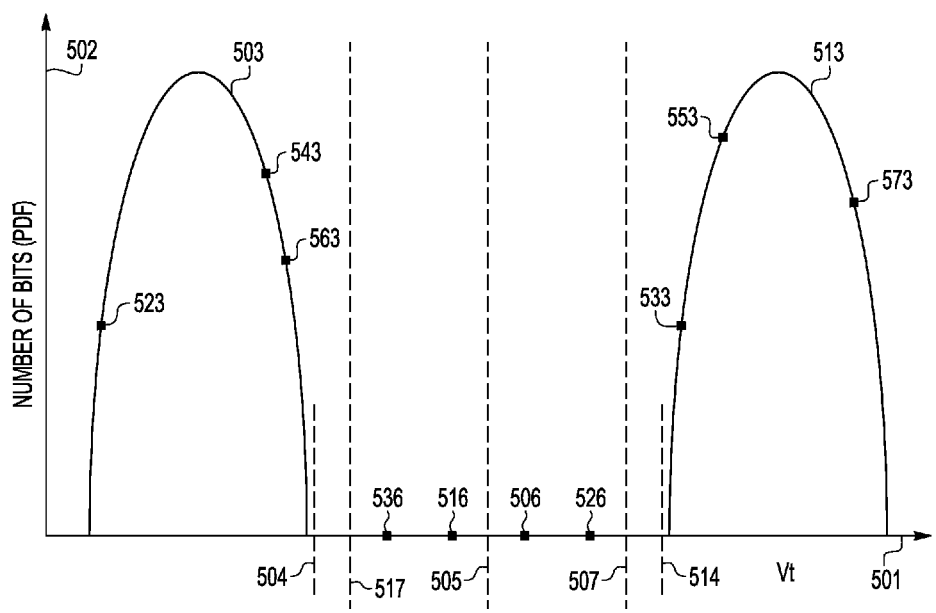
FIG. 5 is a graph illustrating operational levels in relation to a program distribution, an erase distribution, and double/multiple extrinsic bits in accordance with at least one embodiment.

FIG. 5 is a graph illustrating operational levels in relation to a program distribution, an erase distribution, and double/multiple extrinsic bits in accordance with at least one embodiment. The graph is plotted with respect to a linear x axis 501 and a logarithmic y axis 502. The linear x axis 501 represents threshold voltages (Vt) of bit cells containing bits. The logarithmic y axis 502 represents the number of bit cells having the corresponding threshold voltages represented with respect to the linear x axis 501. The bit threshold voltage distribution of FIG. 5 comprises an erase distribution and a program distribution.

While FIG. 5 illustrates extrinsic bits 506, 526, 516, and 536, it will be appreciated that for purposes of discussion, not all of these extrinsic bits need exist simultaneously. As such, various combinations of such extrisic bits are discussed below to illustrate examples of various types of possible errors from which a memory may be salvaged in accordance with at least one embodiment. As one example, extrinsic bits 506 and 526 from erase population 503 may be present, but all program bits may be within program population 513 (i.e., extrinsic bits 516 and 536 would not be present where illustrated in FIG. 5) As another example, extrinsic bits 516 and 536 from program population 513 may be present, but all erase bits may be within program population 503 (i.e., extrinsic bits 506 and 526 would not be present where illustrated in FIG. 5). Other possibilities include, but are not limited to, a presence of one or more of extrinsic bits 506 and 526 from erase population 503 along with one or more of extrinsic bits 516 and 536 from program population 513. One such possibility is the presence of all of extrinsic bits 506, 526, 516, and 536, for which a particularly robust ECC technique should be used if salvage of the memory is to be achieved.

The erase distribution of FIG. 5 includes a main erase distribution 503 that is within a normal read level 505 (e.g., the bits of main erase distribution 503 are below the normal read level 505) and is consistent with an expected erase distribution and double/multiple extrinsic bits 506, 526 that are not within the normal read level 505, e.g., they are extrinsic to main erase distribution 503 (e.g., double/multiple extrinsic bits 506, 526 represent those bits that failed to be successfully read with respect to normal read level 505 and in combination form a double bit error). Main erase distribution 503 reflects an erase distribution that would be typical, e.g., an expected erase distribution. Together, main erase distribution 503 and double/multiple extrinsic bits 506, 526 constitute an actual erase distribution. Main erase distribution 503 comprises a plurality of bits, wherein the threshold voltages of bits among the plurality of bits may vary from one another. Double/multiple extrinsic bits 506, 526 may also comprise a plurality of bits, wherein the threshold voltages of bits among the plurality of bits may also vary from one another (and, clearly, from the threshold voltages of the bits of main erase distribution 503). The actual erase distribution comprising main erase distribution 503 and double/multiple extrinsic bits 506, 526 is plotted with respect to linear x axis 501 and logarithmic y axis 502. Erase verify level 504 is a voltage slightly higher than the highest voltage of the expected erase distribution 503. Normal read level 505 is higher still in voltage, but lower in voltage than the threshold voltage of double/multiple extrinsic bits 506, 526. Thus, normal read level 505 is insufficient to read the erased double/multiple extrinsic bits 506, 526 accurately. Since error correcting code (ECC) can detect double/multiple extrinsic bits 506, 526 (e.g., can detect that a plurality of bit errors have occurred within an ECC section) but cannot provide enough information to correct double/multiple extrinsic bits 506, 526, the failure to accurately read double/multiple extrinsic bits 506, 526 can be detected using ECC. Then, in accordance with at least one embodiment, a higher dynamic read level 507, as compared to the normal read level 505, can be used to attempt to read double/multiple extrinsic bits 506, 526 and a lower dynamic read level 517 can be used to attempt to read the erased double/multiple extrinsic bits 506, 526. Since lower dynamic read level 517 is still lower in voltage than the threshold voltage of double/multiple extrinsic bits 506, 526, attempting to read double/multiple extrinsic bits 506, 526 using lower dynamic read level 517 is not successful. However, since higher dynamic read level 507 is higher in voltage than the threshold voltage of double/multiple extrinsic bits 506, 526, attempting to read double/multiple extrinsic bits 506, 526 using higher dynamic read level 507 is successful. Thus, the memory can be salvaged.

By attempting to read double/multiple extrinsic bits 506, 526 using both higher dynamic read level 507 and lower dynamic read level 517, a memory can often be salvaged even from a combination of extrinsic bits from an erase population and/or a program population. For example, extrinsic bits from an erase population can be recovered, so long as the higher dynamic read level 507 is above the threshold voltage levels of extrinsic bits 506 and 526, and extrinsic bits from a program population can be recovered, so long as the lower dynamic read level 517 is below the threshold voltage levels of extrinsic bits 516 and 536.

The program distribution of FIG. 5 includes a distribution 513 that is within a normal read level 505 and consistent with an expected program distribution and double/multiple extrinsic bits 516, 536 that are not within the normal read level 505. Program verify level 514 is a voltage slightly lower than the lowest voltage of the expected program distribution 513. Normal read level 505 is lower still in voltage, but higher in voltage than the threshold voltage of double/multiple extrinsic bits 516, 536. Thus, normal read level 505 is too high to read double/multiple extrinsic bits 516, 536 accurately. Since error correcting code (ECC) can detect double/multiple extrinsic bits 516, 536 (e.g., can detect that a plurality of bit errors have occurred within an ECC section) but cannot correct double/multiple extrinsic bits 516, 536, the failure to accurately read double/multiple extrinsic bits 516, 536 can be detected using ECC. Then, in accordance with at least one embodiment, a lower dynamic read level 517 can be used to attempt to read double/multiple extrinsic bits 516, 536 and a higher dynamic read level 507 can be used to attempt to read double/multiple extrinsic bits 516, 536. Since higher dynamic read level 507 is still higher in voltage than the threshold voltage of double/multiple extrinsic bits 516, 536, attempting to read double/multiple extrinsic bits 516, 536 using higher dynamic read level 507 is not successful. However, since lower dynamic read level 517 is lower in voltage than the threshold voltage of double/multiple extrinsic bits 516, 536, attempting to read double/multiple extrinsic bits 516, 536 using lower dynamic read level 517 is successful. Thus, the memory can be salvaged.

By attempting to read double/multiple extrinsic bits 516, 536 using both lower dynamic read level 517 and higher dynamic read level 507, a memory can often be salvaged even from a combination of extrinsic bits from a program population and/or an erase population. For example, extrinsic bits from a program population can be recovered so long as the lower dynamic read level 517 is below the threshold voltage levels of extrinsic bits 516 and 536, and extrinsic bits from an erase population can be recovered so long as the higher dynamic read level 507 is above the threshold voltage levels of extrinsic bits 506 and 526.

Since the correct state of double/multiple extrinsic bits is not known prior to an attempt to salvage memory in accordance with at least one embodiment, it is not known, in advance, whether a lower dynamic read level or a higher dynamic read level will allow one or more bits that cannot be read properly to be read properly or will cause one or more bits that are being read properly not to be read properly. However, the ability of the ECC technique to detect and correct a single bit error is useful, as use of the lower dynamic read level and/or the higher dynamic read level can often allow double/multiple bit errors to be reduced to a single bit error, which is correctable using the ECC technique (or to no bit error at all, which doesn't require correction).

Figure 6:
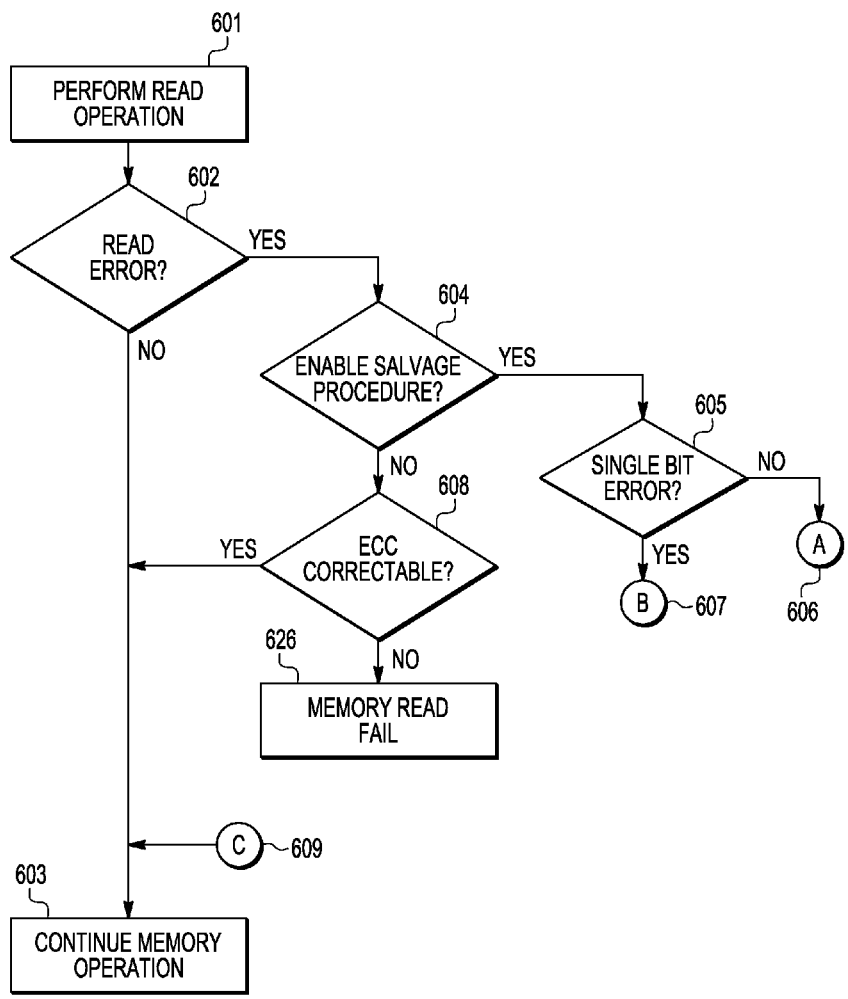
FIG. 6 is a flow diagram illustrating a method for making a salvage procedure available to a memory operation in accordance with at least one embodiment.

FIG. 6 is a flow diagram illustrating a method for making a salvage procedure available to a memory operation in accordance with at least one embodiment. The method begins in block 601, where a memory read operation is performed. From block 601, the method continues to decision block 602. In decision block 602, a decision is made as to whether or not a memory read error has occurred. If not, the method continues to block 603, where the memory operation continues. However, if, in decision block 602, a decision is made that a memory read error has occurred, the method continues to decision block 604, where a decision is made whether or not to enable a salvage procedure. If not, the method continues to decision block 608, where a decision is made as to whether or not the memory read error is correctable by an error correction code (ECC) technique. If so, the method continues to block 603, where the memory operation continues, allowing the ECC technique to correct the memory read error. If not, the method continues to block 626, where the memory read fails.

If, in decision block 604, a decision is made that the salvage procedure is to be enabled, the method continues to decision block 605, where a decision is made as to whether or not a single bit error has occurred. If not, the method continues to reference A in block 606. Reference A in block 606 can lead to a double-bit or multiple-bit salvage scheme, for example, any of the methods illustrated in FIG. 8, 9, or 10. For example, reference A in block 606 can lead to reference A0 in block 800 of FIG. 8, or, as another example, reference A1 in block 901 of FIG. 9 or, as yet another example, to reference A2 in block 1001 of FIG. 10. If a decision is made in decision block 605 that a single bit error occurred, the method continues to reference B in block 607. Reference B in block 607 of FIG. 6 leads to reference B in block 607 of FIG. 7. Reference C in block 609 of FIG. 6 leads to block 603 of FIG. 6, where the memory operation continues.

Figure 7:
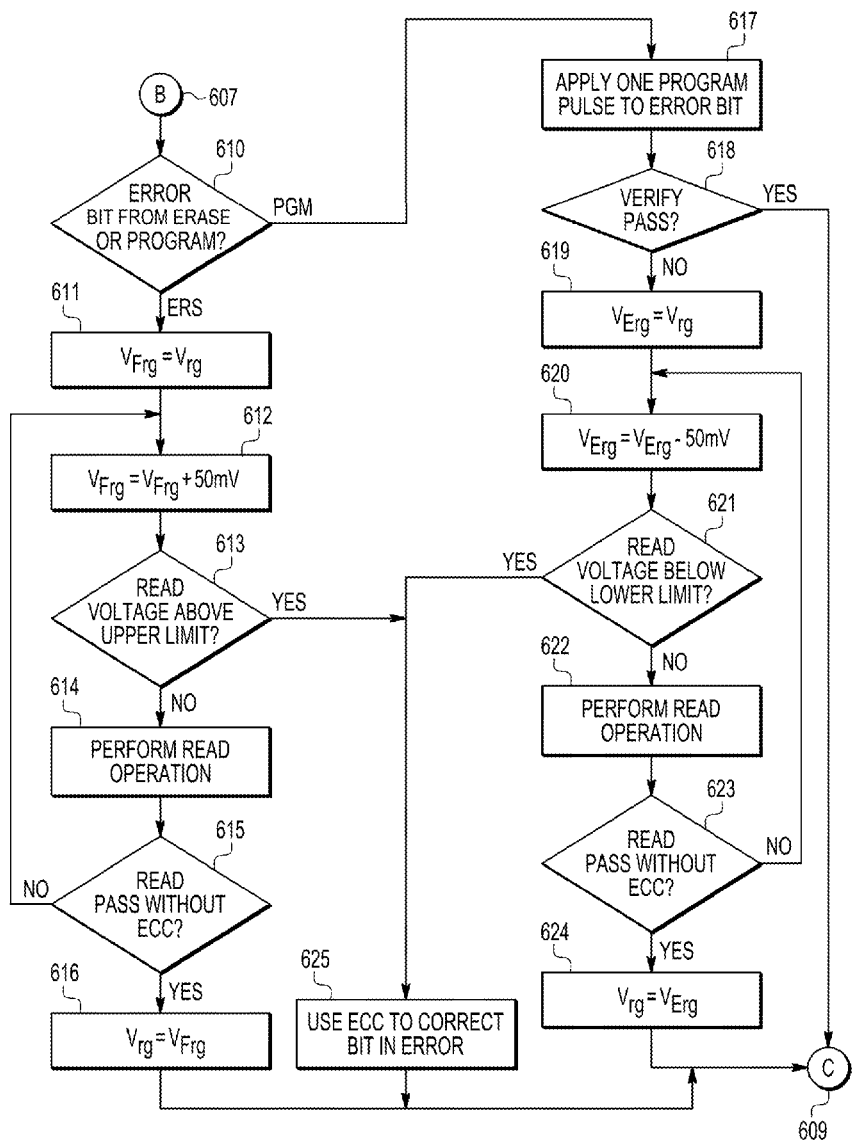
FIG. 7 is a flow diagram illustrating a method for processing a single bit memory read error in accordance with at least one embodiment.

FIG. 7 is a flow diagram illustrating a method for processing a single bit memory read error in accordance with at least one embodiment. The method begins at reference B in block 607, which, as noted above, may continue from reference B in block 607 of FIG. 6. From reference B in block 607, the method continues to decision block 610, where a decision is made as to whether or not the error bit is from an erase population or from a program population. If the error bit is from an erase population, the method continues to block 611. In block 611, a voltage $V_{Frg}$, used for testing read operation performance above the preexisting reading voltage $V_{rg}$, is set to be equal to a voltage $V_{rg}$, the preexisting reading voltage. In block 612, the voltage $V_{Frg}$ is incremented by 50 millivolts (or some other small increment relative to the magnitude of the voltage $V_{Frg}$). From block 612, the method continues to decision block 613. In decision block 613, a decision is made as to whether or not the read voltage $V_{Frg}$ is above an upper limit. If so, the method continues to block 625, where an error correction coding (ECC) technique is used to correct the error bit. From block 625, the method continues to reference C in block 609, which leads back to reference C in block 609 of FIG. 6. If, in decision block 613, a decision is made that the read voltage $V_{Frg}$ is not above an upper limit, the method continues to block 614, where a read operation is performed using the read voltage $V_{Frg}$. From block 614, the method continues to decision block 615, where a decision is made as to whether or not the read passes (i.e., the read operation of block 614 yielded a correct memory read) without the assistance of an ECC technique. If not, the method returns to block 612. If so, the method continues to block 616, where the voltage $V_{rg}$ to be used for subsequent memory read operations is set equal to the read voltage $V_{Frg}$. From block 616, the method continues to reference C in block 609, which leads back to reference C in block 609 of FIG. 6.

If, in decision block 610, a decision is made that the error bit is from a program population, the method continues in block 617. In block 617, one program pulse is applied to the error bit. From block 617, the method continues to decision block 618, where a decision is made as to whether or not a verify operation on the bit passes, indicating that the bit is verified to have been successfully restored to the program population such that it can be expected to be read as a programmed bit during subsequent memory read operations reading it. If so, the method continues to reference C in block 609, which leads back to reference C in block 609 of FIG. 6. If not, method continues to block 619. In block 619, a voltage $V_{Erg}$, used for testing read operation performance below the preexisting reading voltage $V_{rg}$, is set to be equal to a voltage $V_{rg}$, the preexisting reading voltage. In block 620, the voltage $V_{Erg}$ is decremented by 50 millivolts (or some other small increment relative to the magnitude of the voltage $V_{Erg}$). From block 620, the method continues to decision block 621. In decision block 621, a decision is made as to whether or not the read voltage $V_{Erg}$ is below a lower limit. If so, the method continues to block 625, where an error correction code (ECC) technique is used to correct the error bit. From block 625, the method continues to reference C in block 609, which leads back to reference C in block 609 of FIG. 6. If, in block 621, a decision is made that the read voltage $V_{Erg}$ is not below a lower limit, the method continues to block 622, where a read operation is performed using the read voltage $V_{Erg}$. From block 622, the method continues to decision block 623, where a decision is made as to whether or not the read passes (i.e., the read operation of block 622 yielded a correct memory read) without the assistance of an ECC technique. If not, the method returns to block 620. If so, the method continues to block 624, where the voltage $V_{rg}$ to be used for subsequent memory read operations is set equal to the read voltage $V_{Erg}$. From block 624, the method continues to reference C in block 609, which leads back to reference C in block 609 of FIG. 6.

The adjusted read voltage to be used for subsequent memory read operations may be used for all subsequent read operations on all memory locations of the memory or the read voltage may be further adjusted by subsequent iterations of the method based either on an attempted read of the same memory location or a different memory location. Moreover, the range of memory locations over which the adjusted read voltage is to be used for subsequent memory read operations may be selected with finer granularity. As an example, multiple blocks may be defined within the memory such that a separate adjusted read voltage is maintained for each block and used for subsequent memory read operations in that block but not for subsequent memory read operations in other blocks. As another example, the method may comprise dynamically defining a memory block (which may be as small as a single memory location) over which the adjusted read voltage is to be used for subsequent read operations. Adjusted read voltage information descriptive of the adjusted read voltage (or an adjustment to a nominal read voltage) may be stored in a portion of NVM, such as a test NVM area, and may be retrieved to determine the adjusted read voltage to be used for subsequent memory read operations. In the case of memory blocks of finer granularity than the entire memory, memory block information indicative of the memory block to which a corresponding adjusted read voltage pertains may also be stored in such a portion of the NVM. In the case of a dynamically defined memory block, information descriptive of such dynamically defined memory block may be stored in such a portion of the NVM to allow determination of whether the corresponding adjusted read voltage should be used for a subsequent memory read operation.

Figure 8:
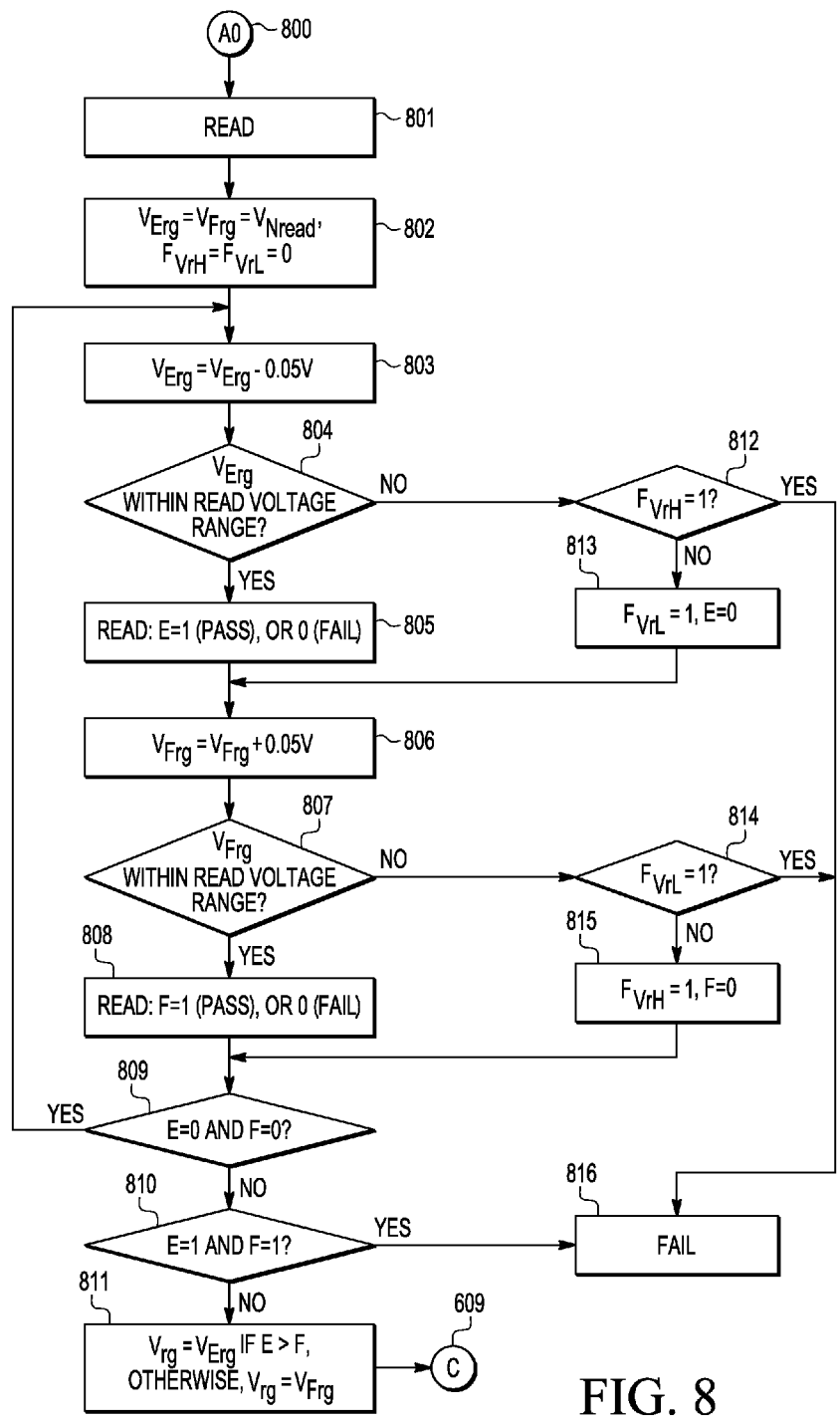
FIG. 8 is a flow diagram illustrating a method for performing a dynamic read pass in accordance with at least one embodiment.

FIG. 8 is a flow diagram illustrating a method for performing a dynamic read pass in accordance with at least one embodiment. The method of FIG. 8 may be used, for example, to perform a dynamic read process to facilitate recovery from double bit errors or multiple bit errors. In block 801, a read operation is performed. From block 801, the method continues at block 802. In block 802, a lower read voltage level and a higher read voltage level are both set to be equal to a first read voltage level (e.g., a normal read voltage level), and both $F_{VrH}$ and $F_{VrL}$ are set to zero. From block 802, the method continues to block 803. In block 803, the lower read voltage level is reduced by a decremental amount (e.g., 50 millivolts). From block 803, the method continues to decision block 804. In decision block 804, a decision is made as to whether or not the reduced lower read voltage level is within an acceptable read voltage range. If not, the method continues to decision block 812, where a decision is made as to whether or not $F_{VrH}$ is equal to one. If so, the method continues to block 816, where the attempt to salvage the memory fails. If not, the method continues to block 813, where $F_{VrL}$, which is a variable serving as a flag to indicate that the reduced lower voltage level is not within the acceptable voltage range, is set to one, and E, which is a variable serving as a lower read voltage level read success flag, is set to zero. From block 813, the method continues to block 806, which will be described below. If, in decision block 804, a decision is made that $V_{Erg}$ is with the read voltage range, the method continues to block 805, where a read operation is performed and a lower read voltage level read success flag is set to a first binary value (e.g., zero) if the read operation is unsuccessful or to a second binary value (e.g., one) if the read operation is successful. The success or failure of the read operation can be determined using the error correcting code (ECC) information and the processes associated therewith. For example, if the read operation performed with the lower read voltage level reduced by a decremental amount results in all bits within the ECC section being able to be read without any errors, the ECC technique does not indicate any errors, so the read operation is deemed to be successful, and the lower read voltage level read success flag is set to the second binary value. As another example, if the read operation performed with the lower read voltage level reduced by a decremental amount results in a single bit error within the ECC section, the ECC technique is capable of not only detecting, but also correcting, that single bit error. Therefore, upon correction of the single bit error by the ECC technique, the read operation is deemed to be successful, and the lower read voltage level read success flag is set to the second binary value. As yet another example, if the read operation is performed with the lower read voltage level reduced by the decremental amount still results in double/multiple bit errors (which may or may not be the same bit errors that caused the salvage process to be invoked), the read operation is deemed to be unsuccessful, and the lower read voltage level read success flag is set to the first binary value.

From block 805, the method continues to block 806, where the higher read voltage level is increased by an incremental amount (e.g., 50 millivolts). From block 806, the method continues to decision block 807. In decision block 807, a decision is made as to whether or not the increased higher read voltage level is within an acceptable read voltage range. If not, the method continues to decision block 814, where a decision is made as to whether or not $F_{VrL}$ is equal to one. If so, the method continues to block 816, where the attempt to salvage the memory fails. If not, the method continues to block 815, where $F_{VrH}$, which is a variable serving as a flag to indicate that the increased higher read voltage level is not within the acceptable voltage range, is set to one, and F, which is a variable serving as a higher read voltage level read success flag, is set to zero. From block 815, the method continues to decision block 809, which will be described below. If, in decision block 807, a decision is made that $V_{Frg}$ is with the read voltage range, the method continues to block 808, where a read operation is performed and a higher read voltage level read success flag is set to a first binary value (e.g., zero) if the read operation is unsuccessful or to a second binary value (e.g., one) if the read operation is successful. The success or failure of the read operation can be determined using the error correcting code (ECC) information and the processes associated therewith. For example, if the read operation performed with the higher read voltage level increased by an incremental amount results in all bits within the ECC section being able to be read without any errors, the ECC technique does not indicate any errors, so the read operation is deemed to be successful, and the higher read voltage level read success flag is set to the second binary value. As another example, if the read operation performed with the higher read voltage level increased by an incremental amount results in a single bit error within the ECC section, the ECC technique is capable of not only detecting, but also correcting, that single bit error. Therefore, upon correction of the single bit error by the ECC technique, the read operation is deemed to be successful, and the higher read voltage level read success flag is set to the second binary value. As yet another example, if the read operation is performed with the higher read voltage level increased by the incremental amount still results in double/multiple bit errors (which may or may not be the same bit errors that caused the salvage process to be invoked), the read operation is deemed to be unsuccessful, and the higher read voltage level read success flag is set to the first binary value.

From block 808, the method continues to decision block 809, where a decision is made as to whether or not the lower read voltage level read success flag has the first binary value and the higher read voltage level read success flag has the first binary value (i.e., if the lower read voltage level read operation of block 805 and the higher read voltage level read operation of block 808 were both unsuccessful). If so, the method returns to block 803 for further adjustment of the lower read voltage level and, subsequently, the higher read voltage level. If not, the method continues to decision block 810. In decision block 810, a decision is made as to whether or not the lower read voltage level read success flag has the second binary value and the higher read voltage level read success flag has the second binary value (i.e., if the lower read voltage level read operation of block 805 and the higher read voltage level read operation of block 808 were both successful). If so, the method continues to block 816, where the attempt to salvage the memory fails. If, after initial detection of a read error (e.g., in block 602 of FIG. 6), the read error does not occur when using a lower read voltage level (e.g., in lower read voltage level read operation 805) and the read error does not occur when using a higher read voltage level (e.g., in higher read voltage level read operation 808), it can be surmised that the read voltage adjustment in one direction is the real fix and the read voltage adjustment in other direction is a false fix since, in accordance with at least one ECC technique, if more than three extrinsic bits are present in the same ECC section, the ECC may be unable to detect the error, which may result in a false passing result of a read operation (e.g., lower read voltage level read operation 805 or higher read voltage level read operation 808). Thus, the presence of more bits with erroneous values within an ECC section than the ECC technique is designed to handle may be indistinguishable by the ECC technique from the absence of bits with erroneous values within that ECC section. Accordingly, even with erroneous bits, a read operation may pass according to the ECC technique, as if there were no erroneous bits. Therefore, in the case of the lower read voltage level read success flag and the higher read voltage level read success flag both having the second binary value (i.e., the lower read voltage level read operation of block 805 and the higher read voltage level read operation of block 808 both appearing to have been successful), the memory device may be failed (i.e., the memory device may be determined to be unsalvageable) by proceeding to block 816. Failing the memory device in such case may be used to avoid adjusting the read voltage when the ECC technique's error detection capability is unreliable and may provide a false negative (i.e., false passing) result. Refraining from adjusting the read voltage based on unreliable ECC information may prevent introduction of additional erroneously read bits (which might not be detected as being erroneous), thereby optimizing improvement of memory reliability.

If, in decision block 810, a decision is made that either of the lower read voltage level read success flag and the higher read voltage level read success flag do not have the second binary value (i.e., if either the lower read voltage level read operation of block 805 or the higher read voltage level read operation of block 808 were unsuccessful), the method continues to block 811. In block 811, if the lower read voltage level read operation was successful and the higher read voltage level read operation was unsuccessful (e.g., if the lower read voltage level read success flag indicates a successful read operation and the higher read voltage level read success flag indicates an unsuccessful read operation), a new read voltage level for subsequent read operations (e.g., an adjusted first read voltage level, adjusted normal read voltage level) is set to be equal to the lower read voltage level. If the higher read voltage level read operation was successful and the lower read voltage level read operation was unsuccessful (e.g., if the higher read voltage level read success flag indicates a successful read operation and the lower read voltage level read success flag indicates an unsuccessful read operation), a new read voltage level for subsequent read operations (e.g., an adjusted first read voltage level, adjusted normal read voltage level) is set to be equal to the higher read voltage level. From block 811, the attempt to salvage the memory is successful, and the memory passes, so the method continues to reference C in block 609, which leads back to reference C in block 609 of FIG. 6.

Figure 9:
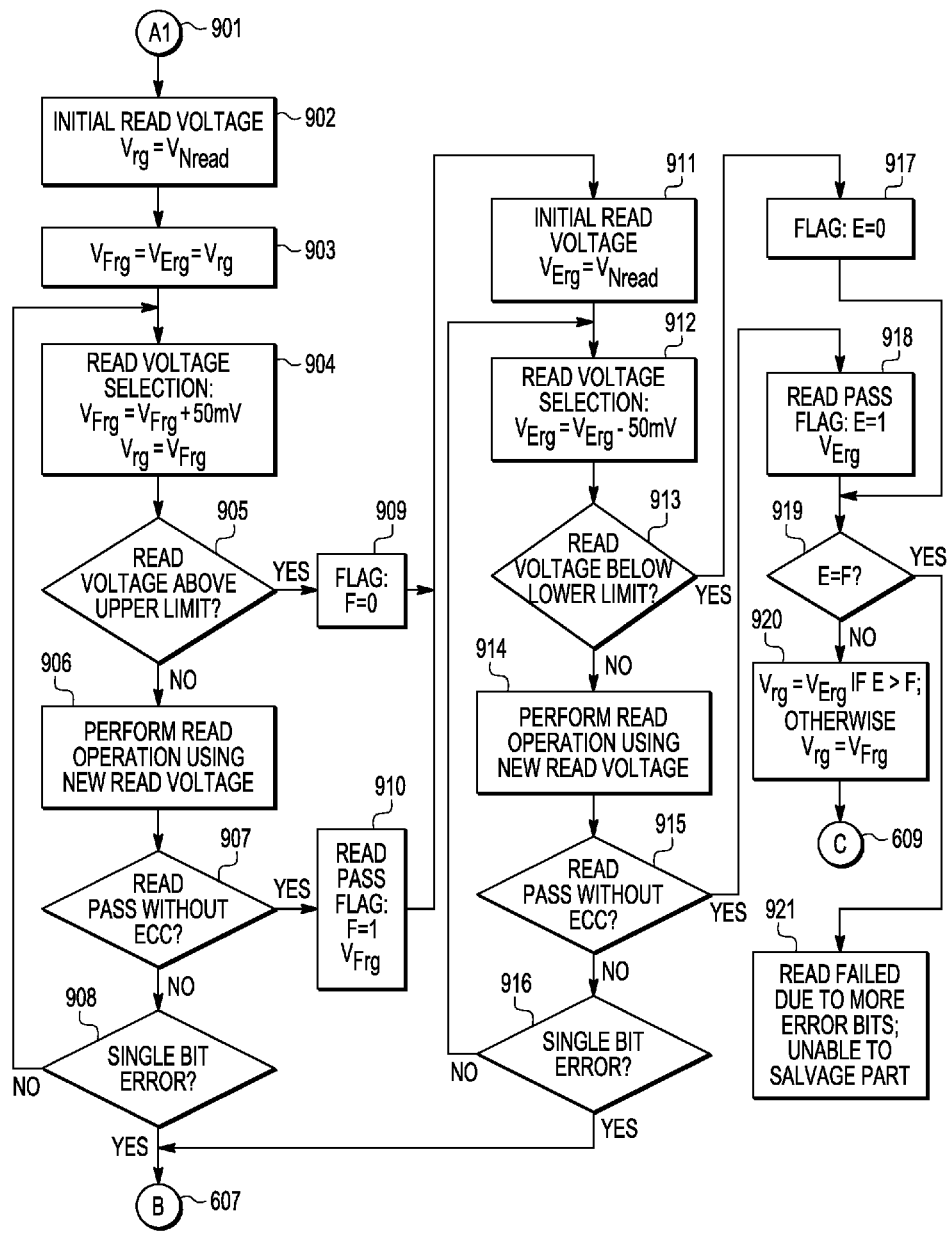
FIG. 9 is a flow diagram illustrating a method for processing a double or multiple bit memory read error in accordance with at least one embodiment.

FIG. 9 is a flow diagram illustrating a method for processing a double or multiple bit memory read error in accordance with at least one embodiment. The method begins at reference A1 in block 901, which, as noted above, may proceed from reference A in block 606 of FIG. 6. From reference A1 in block 901, the method continues to block 902. In block 902, an initial read voltage $V_{rg}$ is set to be equal to a nominal read voltage $V_{Nread}$. From block 902, the method continues to block 903. In block 903, a read voltage $V_{Frg}$, used for testing read operation performance above the initial read voltage $V_{rg}$ is set to be equal to the initial read voltage $V_{rg}$, and a read voltage $V_{Erg}$, used for testing read operation performance below the preexisting reading voltage $V_{rg}$, is set to be equal to the initial read voltage $V_{rg}$. From block 903, the method continues to block 904. In block 904, a read voltage selection is performed, incrementing $V_{Frg}$ by 50 millivolts (or by a small increment relative to the magnitude of read voltage $V_{Frg}$), and initial read voltage $V_{rg}$ is set to be equal to read voltage $V_{Frg}$. From block 904, the method continues to decision block 905, where a decision is made as to whether or not the read voltage $V_{Frg}$ is above an upper limit. If so, the method continues to block 909, where a read fail is indicated by setting a flag F to a value zero. From block 909, the method continues to block 911, which will be described below. If, in decision block 905, a decision is made that the read voltage $V_{Frg}$ is not above an upper limit, the method continues to block 906, where a read operation is performed using the new (i.e., incremented) read voltage $V_{Frg}$ set in block 904. From block 906, the method continues to decision block 907. In decision block 907, a decision is made as to whether or not the read passes (i.e., the read operation of block 906 yielded a correct memory read) without the assistance of an ECC technique. If so, the method continues to block 910, where a read pass is indicated by setting a flag F to a value one. From block 910, the method continues to block 911, which will be described below. If, in decision block 907, a decision is made that the read does not pass (i.e., is not correct) without the assistance of an ECC technique, the method continues to decision block 908. In decision block 908, a decision is made as to whether or not the read error is a single bit error. If not, the method returns to block 904. If so, the method continues to reference B in block 607, which leads to reference B in block 607 of FIG. 7.

As noted above, from either of blocks 909 or 910, the method can continue to block 911. In block 911, an initial read voltage is set by setting a read voltage $V_{Erg}$ to be equal to a nominal read voltage $V_{Nread}$. From block 911, the method continues to block 912. In block 912, a read voltage selection is made by decrementing read voltage $V_{Erg}$ by 50 millivolts (or by a small increment relative to the magnitude of read voltage $V_{Erg}$). From block 912, the method continues to decision block 913, where a decision is made as to whether or not the read voltage $V_{Erg}$ is below a lower limit. If not, the method continues to block 914, where a read operation using the new (i.e., decremented) read voltage $V_{Erg}$ is performed. From block 914, the method continues to decision block 915. In decision block 915, a decision is made as to whether or not the read operation of block 914 passes (i.e., reads correctly) without the assistance of an ECC technique. If not, the method continues to decision block 916, where a decision is made as to whether or not the memory read error is a single bit error. If not, the method returns to block 912. If so, the method continues to reference B in block 607, which leads to reference B in block 607 of FIG. 7.

If, in decision block 913, a decision is made that the read voltage $V_{Erg}$ is below the lower limit, the method continues to block 917, where a read fail is indicated by setting a flag E to a value zero. From block 917, the method continues to decision block 919, which will be described below. If, in decision block 915, a decision is made that the read operation of block 914 passes (i.e., reads correctly) without the assistance of an ECC technique, the method continues to block 918, where a read pass is indicated by setting a flag E to a value one. From block 918, the method continues to decision block 919. As noted above, from either of blocks 917 or 918, the method may continue to decision block 919. In decision block 919, a decision is made as to whether or not the value of flag E is equal to the value of flag F. If so, the method continues to block 921, where an indication is provided that the read failed due to more error bits and that the salvage procedure is unable to salvage the part. If not, the method continues to block 920, where the initial read voltage, $V_{rg}$, which will be used for subsequent read operations, is set to be equal to the read voltage $V_{Erg}$ if the value of the flag E is greater than the value of the flag F and is otherwise set to be equal to the read voltage $V_{Frg}$. From block 920, the method continues to reference C in block 609, which leads back to reference C in block 609 of FIG. 6.

Figure 10:
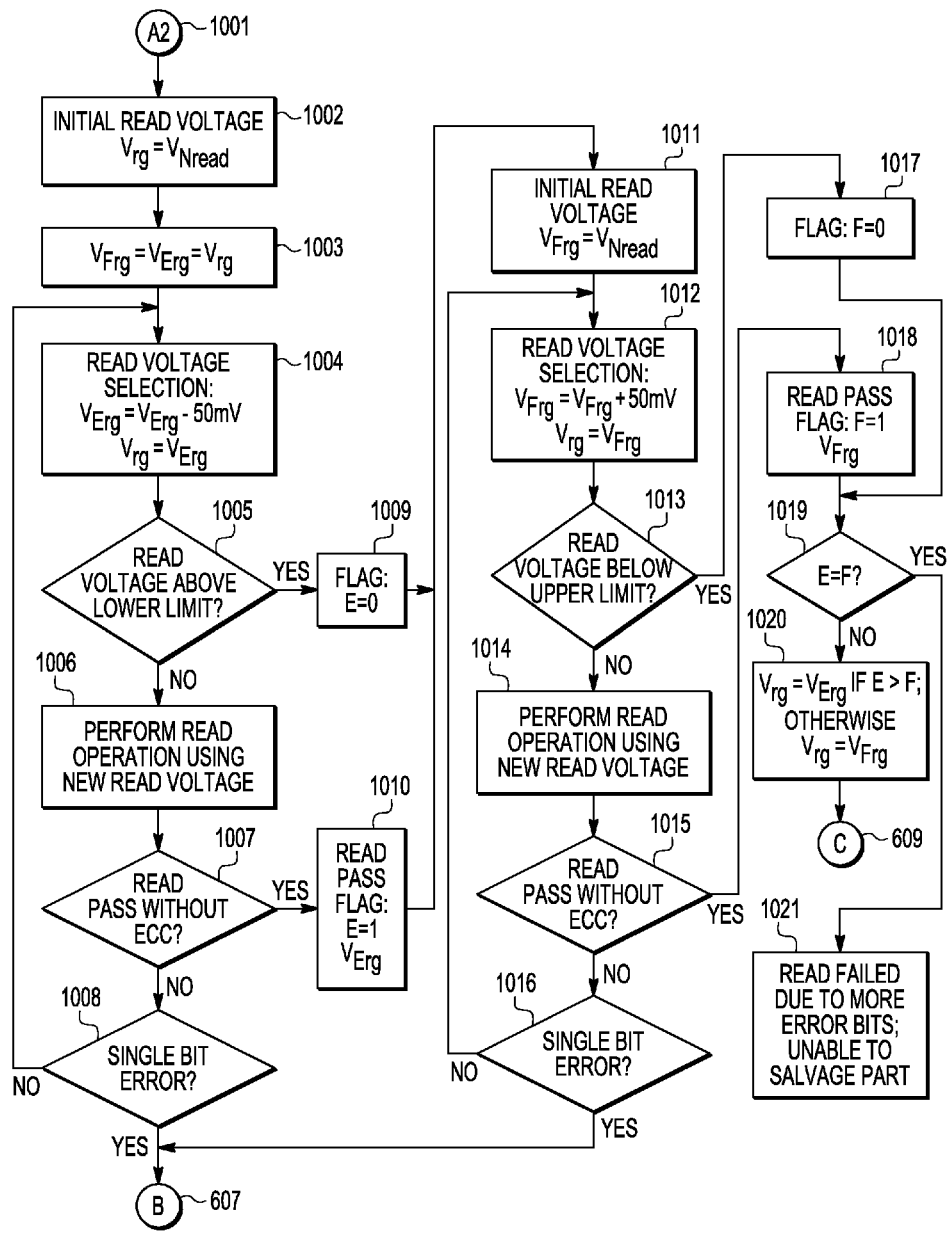
FIG. 10 is a flow diagram illustrating a method for processing a double or multiple bit memory read error in accordance with at least one embodiment.

FIG. 10 is a flow diagram illustrating a method for processing a double or multiple bit memory read error in accordance with at least one embodiment. The method begins at reference A2 in block 1001, which, as noted above, may proceed from reference A in block 606 of FIG. 6. From reference A2 in block 1001, the method continues to block 1002. In block 1002, an initial read voltage $V_{rg}$ is set to be equal to a nominal read voltage $V_{Nread}$. From block 1002, the method continues to block 1003. In block 1003, a read voltage $V_{Frg}$, used for testing read operation performance above the initial read voltage $V_{rg}$ is set to be equal to the initial read voltage $V_{rg}$, and a read voltage $V_{Erg}$, used for testing read operation performance below the preexisting reading voltage $V_{rg}$, is set to be equal to the initial read-voltage $V_{rg}$. From block 1003, the method continues to block 1004. In block 1004, a read voltage selection is performed, decrementing $V_{Erg}$ by 50 millivolts (or by a small increment relative to the magnitude of read voltage $V_{Erg}$), and initial read voltage $V_{rg}$ is set to be equal to read voltage $V_{Erg}$. From block 1004, the method continues to decision block 1005, where a decision is made as to whether or not the read voltage $V_{Erg}$ is below a lower limit. If so, the method continues to block 1009, where a read fail is indicated by setting a flag E to a value zero. From block 1009, the method continues to block 1011, which will be described below. If, in decision block 1005, a decision is made that the read voltage $V_{Erg}$ is not below a lower limit, the method continues to block 1006, where a read operation is performed using the new (i.e., decremented) read voltage $V_{Erg}$ set in block 1004. From block 1006, the method continues to decision block 1007. In decision block 1007, a decision is made as to whether or not the read passes (i.e., the read operation of block 1006 yielded a correct memory read) without the assistance of an ECC technique. If so, the method continues to block 1010, where a read pass is indicated by setting a flag E to a value one. From block 1010, the method continues to block 1011, which will be described below. If, in decision block 1007, a decision is made that the read does not pass (i.e., is not correct) without the assistance of an ECC technique, the method continues to decision block 1008. In decision block 1008, a decision is made as to whether or not the read error is a single bit error. If not, the method returns to block 1004. If so, the method continues to reference B in block 607, which leads to reference B in block 607 of FIG. 7.

As noted above, from either of blocks 1009 or 1010, the method can continue to block 1011. In block 1011, an initial read voltage is set by setting a read voltage $V_{Frg}$ to be equal to a nominal read voltage $V_{Nread}$. From block 1011, the method continues to block 1012. In block 1012, a read voltage selection is made by incrementing read voltage $V_{Frg}$ by 50 millivolts (or by a small increment relative to the magnitude of read voltage $V_{Frg}$). From block 1012, the method continues to decision block 1013, where a decision is made as to whether or not the read voltage $V_{Frg}$ is above an upper limit. If not, the method continues to block 1014, where a read operation using the new (i.e., incremented) read voltage $V_{Frg}$ is performed. From block 1014, the method continues to decision block 1015. In decision block 1015, a decision is made as to whether or not the read operation of block 1014 passes (i.e., reads correctly) without the assistance of an ECC technique. If not, the method continues to decision block 1016, where a decision is made as to whether or not the memory read error is a single bit error. If not, the method returns to block 1012. If so, the method continues to reference B in block 607, which leads to reference B in block 607 of FIG. 7.

If, in decision block 1013, a decision is made that the read voltage $V_{Frg}$ is above the upper limit, the method continues to block 1017, where a read fail is indicated by setting a flag F to a value zero. From block 1017, the method continues to decision block 1019, which will be described below. If, in decision block 1015, a decision is made that the read operation of block 1014 passes (i.e., reads correctly) without the assistance of an ECC technique, the method continues to block 1018, where a read pass is indicated by setting a flag F to a value one. From block 1018, the method continues to decision block 1019. As noted above, from either of blocks 1017 or 1018, the method may continue to decision block 1019. In decision block 1019, a decision is made as to whether or not the value of flag E is equal to the value of flag F. If so, the method continues to block 1021, where an indication is provided that the read failed due to more error bits and that the salvage procedure is unable to salvage the part. If not, the method continues to block 1020, where the initial read voltage, $V_{rg}$, which will be used for subsequent read operations, is set to be equal to the read voltage $V_{Erg}$ if the value of the flag E is greater than the value of the flag F and is otherwise set to be equal to the read voltage $V_{Erg}$. From block 1020, the method continues to reference C in block 609, which leads back to reference C in block 609 of FIG. 6.

Unlike ECC, at least one embodiment doesn't need a subset of the memory cells to restore the stored data. At least one embodiment doesn't require a redundant memory device, such as an SRAM buffer, to recover data while programming non-volatile memory.

At least one embodiment may be applied to any NVM Flash technologies including floating gate, TFS, etc. technologies. At least one embodiment may be applied to flash memory, NVM, memory devices without ECC, memory devices with ECC, memory devices, designs, and processes requiring improved reliability, etc.

While populations of bits of particular states have been described with reference to threshold voltages, it should be understood that embodiments may be practiced with memory technologies for which such threshold voltage relationships are applicable but also with memory technologies for which other threshold voltage relationships exist. As an example, while an erase bit population has been illustrated as having a lower range of threshold voltage (i.e., on a left side of a graph) and a program bit population has been illustrated as having a higher range of threshold voltage (i.e., on a right side of the graph), it should be understood that embodiments may be practiced with memory technologies having a program bit population with a lower range of threshold voltage and an erase bit population with a higher range of threshold voltage.

In accordance with at least one embodiment, a method, performed by a memory controller, the method comprises performing a memory read operation using a first read voltage level; detecting that the memory read operation has resulted in a memory read error wherein more than one bit is incorrect; and, in response to detecting the memory read error, performing a higher read voltage memory read operation using a higher read voltage level higher than the first read voltage level; performing a lower read voltage memory read operation using a lower read voltage level lower than the first read voltage level; and selecting a revised read voltage level for subsequent memory read operations based on the performing the higher read voltage memory read operation and the performing the lower read voltage memory read operation, wherein the revised read voltage improves memory reliability. In accordance with at least one embodiment, the performing the higher read voltage memory read operation comprises checking if the memory read error wherein the more than one bit is incorrect occurs when using the higher read voltage level; wherein the performing the lower read voltage memory read operation comprises checking if the memory read error wherein the more than one bit is incorrect occurs when using the lower read voltage level; and wherein the selecting the revised read voltage level for the subsequent memory read operations comprises when the memory read error wherein the more than one bit is incorrect does not occur when using the higher read voltage level, selecting the revised read voltage level to be the higher read voltage level; and, when the memory read error wherein the more than one bit is incorrect does not occur when using the lower read voltage level, selecting the revised read voltage level to be the lower read voltage level. In accordance with at least one embodiment, the selecting the revised read voltage level for the subsequent memory read operations further comprises, when the memory read error wherein the more than one bit is incorrect occurs when using the higher read voltage level and occurs when using the lower read voltage level, increasing the higher read voltage level, decreasing the lower read voltage level, and reiterating the performing the higher read voltage memory read operation, the performing the lower read voltage memory read operation, and the selecting the revised read voltage level. In accordance with at least one embodiment, the selecting the revised read voltage level for the subsequent memory read operations further comprises, when the higher read voltage level is higher than a highest permissible read voltage level or when the lower read voltage level is lower than a lowest permissible read voltage level, terminating the method with a memory device unsalvageable result. In accordance with at least one embodiment, the selecting the revised read voltage level for the subsequent memory read operations further comprises, when the memory read error wherein the more than one bit is incorrect does not occur when using the higher read voltage level and does not occur when using the lower read voltage level, terminating the method with a memory device unsalvageable result. In accordance with at least one embodiment, the method further comprises detecting a single-bit memory read error wherein only one bit is read incorrectly; and performing an error correction operation using an error correcting code (ECC) to correct the only one bit read incorrectly. In accordance with at least one embodiment, the method further comprises performing a subsequent memory read operation of the subsequent memory read operations by applying the revised read voltage level to a transistor sate terminal of a memory cell. In accordance with at least one embodiment, the memory cell is a nonvolatile memory (NVM) cell.

In accordance with at least one embodiment, a method, performed by a memory controller, the method comprises performing a memory read operation using a first read voltage level; performing error correction of an error correctable memory read error to correctly read at least one erroneous bit; when the at least one erroneous bit is among an erase population, performing a higher read voltage memory read operation using a higher read voltage level higher than the first read voltage level; when the at least one erroneous bit is among a program population, programming the at least one erroneous bit to a program state; and, when the at least one erroneous bit is among the program population, performing a lower read voltage memory read operation using a lower read voltage level lower than the first read voltage level. In accordance with at least one embodiment, the method further comprises selecting a revised read voltage level for subsequent memory read operations based on the, when the at least one erroneous bit is among the erase population, performing the higher read voltage memory read operation or the, when the at least one erroneous bit is among the program population, performing the lower read voltage memory read operation, wherein the revised read voltage improves memory reliability. In accordance with at least one embodiment, the method further comprises, when the at least one erroneous bit is among an erase population and the performing the higher read voltage memory read operation using the higher read voltage level higher than the first read voltage level does not allow correct reading of the at least one erroneous bit without reliance on an error correction coding (ECC) technique, increasing the higher read voltage level and reiterating the performing the higher read voltage memory read operation using the higher read voltage level higher than the first read voltage level. In accordance with at least one embodiment, the method further comprises, when the at least one erroneous bit is among the program population and the performing the lower read voltage memory read operation using the lower read voltage level lower than the first read voltage level does not allow correct reading of the at least one erroneous bit without reliance on an error correction coding (ECC) technique, decreasing the lower read voltage level and reiterating the performing a lower read voltage memory read operation using the lower read voltage level lower than the first read voltage level. In accordance with at least one embodiment, the method further comprises, when the higher read voltage level is higher than a highest permissible read voltage level or when the lower read voltage level is lower than a lowest permissible read voltage level, relying on an error correction coding (ECC) technique to correct the at least one erroneous bit, if possible, and, if not possible, terminating the method with a memory device unsalvageable result.

In accordance with at least one embodiment, a memory comprises a memory array for storing a plurality of data bits; and a memory controller coupled to the memory array, the memory controller comprising control circuitry configured to cause the memory controller to perform a memory read operation using a memory read voltage level to read a data unit (e.g., a data word) comprising a portion of the plurality of data bits, to detect a memory read error wherein at least one data bit of the data unit is read incorrectly, to adjust the memory read voltage level to obtain an adjusted memory read voltage level, to perform a second memory read operation using the adjusted memory read voltage level to reread the data unit, and to determine if the data unit has been reread correctly using the adjusted memory read voltage level. In accordance with at least one embodiment, the memory controller further comprises control circuitry configured to cause the memory controller, when the memory controller has determined that the data unit has not been reread correctly using the adjusted memory read voltage level, to reiterate the adjusting the memory read voltage level to obtain the adjusted memory read voltage level, the performing the second memory read operation using the adjusted memory read voltage level to reread the data unit, and the determining if the data unit has been reread correctly using the adjusted memory read voltage level. In accordance with at least one embodiment, the memory controller further comprises control circuitry configured to cause the memory controller, when the adjusted memory read voltage level is beyond a permissible memory read voltage level range, to terminate the method and to deem the memory device to be unsalvageable. In accordance with at least one embodiment, the control circuitry configured to cause the memory controller to detect the memory read error wherein the at least one data bit of the data unit is read incorrectly further comprises control circuitry configured to cause the memory controller to detect the memory read error wherein a number of data bits of the data unit read incorrectly exceeds a correctable number of data bits correctable by an error correcting code (ECC) technique. In accordance with at least one embodiment, the control circuitry configured to cause the memory controller to detect the memory read error wherein the at least one data bit of the data unit is read incorrectly further comprises control circuitry configured to cause the memory controller to detect the memory read error wherein at least two data bits of the data unit are read incorrectly. In accordance with at least one embodiment, the control circuitry configured to cause the memory controller to adjust the memory read voltage level to obtain an adjusted memory read voltage level further comprises control circuitry configured to cause the memory controller to iteratively adjust the memory read voltage level to be greater than and less than the memory read voltage level to obtain an adjusted memory read voltage level. In accordance with at least one embodiment, the control circuitry configured to cause the memory controller to adjust the memory read voltage level to obtain the adjusted memory read voltage level comprises control circuitry configured to cause the memory controller, when the at least one data bit of the data unit read incorrectly is among an erase population, to adjust the memory read voltage level to be a higher memory read voltage level higher than the memory read voltage level. In accordance with at least one embodiment, the control circuitry configured to cause the memory controller to adjust the memory read voltage level to obtain the adjusted memory read voltage level comprises control circuitry configured to cause the memory controller, when the at least one data bit of the data unit read incorrectly is among a program population, to adjust the memory read voltage level to be a lower memory read voltage level lower than the memory read voltage level. In accordance with at least one embodiment, the memory controller further comprises control circuitry configured to cause the memory controller, when the at least one data bit of the data unit read incorrectly is among a program population, to program the at least one erroneous bit to a program state.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Some of the above embodiments, as applicable, may be implemented using a variety of different information processing systems.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
performing a memory read operation using a first read voltage level;
detecting that the memory read operation has resulted in a memory read error; and
in response to detecting the memory read error includes more than one incorrect bit:
performing a higher read voltage memory read operation using a higher read voltage level higher than the first read voltage level;
performing a lower read voltage memory read operation using a lower read voltage level lower than the first read voltage level; and
selecting a revised read voltage level for subsequent memory read operations based on the performing the higher read voltage memory read operation and the performing the lower read voltage memory read operation,
wherein the selecting the revised read voltage level for the subsequent memory read operations further comprises:
in response to the memory read error occurring in response to using the higher read voltage level and occurring in response to using the lower read voltage level, increasing the higher read voltage level, decreasing the lower read voltage level, and reiterating the performing the higher read voltage memory read operation, the performing the lower read voltage memory read operation, and the selecting the revised read voltage level; and
in response to the memory read error not occurring in response to using the higher read voltage level and not occurring in response to using the lower read voltage level, providing an indicator that a memory device has failed.

2. The method of claim 1 wherein the performing the higher read voltage memory read operation comprises checking if the memory read error occurs in response to using the higher read voltage level;
wherein the performing the lower read voltage memory read operation comprises checking if the memory read error occurs in response to using the lower read voltage level; and
wherein the selecting the revised read voltage level for the subsequent memory read operations comprises in response to the memory read error not occurring in response to using the higher read voltage level, selecting the revised read voltage level to be the higher read voltage level; and
in response to the memory read error not occurring in response to using the lower read voltage level, selecting the revised read voltage level to be the lower read voltage level.

3. The method of claim 1 wherein the selecting the revised read voltage level for the subsequent memory read operations further comprises:
in response to the higher read voltage level being higher than a first predefined read voltage level or in response to the lower read voltage level being lower than a second predefined read voltage level, providing an indicator that a memory device has failed.

4. The method of claim 1 further comprising:
performing a subsequent memory read operation of the subsequent memory read operations by applying the revised read voltage level to a transistor gate terminal of a memory cell.

5. The method of claim 4 wherein the memory cell is a nonvolatile memory (NVM) cell.

6. A memory comprising:
   a memory array for storing a plurality of data bits; and
   a memory controller coupled to the memory array, the memory controller comprising control circuitry configured to cause the memory controller to perform a memory read operation using a memory read voltage level to read a data unit comprising a portion of the plurality of data bits, to detect a memory read error wherein at least one data bit of the data unit is read incorrectly, to iteratively adjust the memory read voltage level to be at a higher read voltage level greater than and a lower read voltage level less than the memory read voltage level to obtain an adjusted memory read voltage level, to perform a second memory read operation using the adjusted memory read voltage level to reread the data unit, to determine if the data unit has been reread correctly using the adjusted memory read voltage level,
   and, in response to the memory read error not occurring in response to using the higher read voltage level and not occurring in response to using the lower read voltage level, providing an indicator that the memory has failed.

7. The memory device of claim 6 wherein the control circuitry is further configured to cause the memory controller, in response to determining that the data unit has not been reread correctly using the adjusted memory read voltage level, to reiterate the adjusting the memory read voltage level to obtain the adjusted memory read voltage level, the performing the second memory read operation using the adjusted memory read voltage level to reread the data unit, and the determining if the data unit has been reread correctly using the adjusted memory read voltage level.

8. The memory device of claim 6 wherein the control circuitry is further configured to cause the memory controller to detect the memory read error wherein a number of data bits of the data unit read incorrectly exceeds a correctable number of data bits correctable by an error correcting code (ECC) technique.

9. The memory device of claim 6 wherein the control circuitry is further configured to cause the memory controller to detect the memory read error wherein at least two data bits of the data unit are read incorrectly.

10. The memory device of claim 6 wherein the control circuitry is further configured to cause the memory controller to adjust the memory read voltage level to be a higher memory read voltage level higher than the memory read voltage level.

11. The memory device of claim 6 wherein the control circuitry is further configured to cause the memory controller to adjust the memory read voltage level to be a lower memory read voltage level lower than the memory read voltage level.

12. The memory device of claim 11 wherein the memory controller further comprises:
   control circuitry configured to cause the memory controller, in response to the at least one data bit of the data unit read incorrectly being among a program population, to program the at least one erroneous bit to a program state.

* * * * *